(12) United States Patent
Moore et al.

(10) Patent No.: US 7,548,177 B2
(45) Date of Patent: Jun. 16, 2009

(54) MULTIPLE FM DITHER

(75) Inventors: George Stennis Moore, Veradale, WA (US); Brad Elwood Andersen, Spokane Valley, WA (US)

(73) Assignee: Agilent Technologies, Inc., Santa Clara, CA (US)

( * ) Notice: Subject to any disclaimer, the term of this patent is extended or adjusted under 35 U.S.C. 154(b) by 295 days.

(21) Appl. No.: 11/464,363

(22) Filed: Aug. 14, 2006

(65) Prior Publication Data

US 2008/0036633 A1    Feb. 14, 2008

(51) Int. Cl.
    *H03M 1/20*    (2006.01)
(52) U.S. Cl. ...................................... 341/131; 398/193

(58) Field of Classification Search ......... 341/130–160;
    398/182–198
    See application file for complete search history.

(56) References Cited

U.S. PATENT DOCUMENTS

| | | | |
|---|---|---|---|
| 5,525,984 A * | 6/1996 | Bunker ........................ 341/131 |
| 6,829,360 B1 * | 12/2004 | Iwata et al. .................... 381/61 |
| 2007/0058866 A1 * | 3/2007 | Boyce et al. ................. 382/181 |
| 2007/0064956 A1 * | 3/2007 | Iwata ........................... 381/61 |

OTHER PUBLICATIONS

Athanasios Papoulis, Polytechnic University—"Probability Random Variables, And Stochastic Processes", Third Edition, McGraw-Hill, Inc., ISBN 0-07-048477-5, Library Of Congress Cataloging-In-Publication Data, 1991; pp. 369-372.

* cited by examiner

*Primary Examiner*—Lam T Mai

(57) ABSTRACT

Multiple noise-FM dither. An analog dither signal is generated by summing two or more noise-FM signals, each noise-FM signal being a carrier modulated by a noise source.

18 Claims, 8 Drawing Sheets

MULTIPLE FM DITHER

TECHNICAL FIELD

Embodiments in accordance with the present invention relate to dithering used in analog to digital conversion, and more particularly, to the generation of analog dither signals.

BACKGROUND

In a perfect world, analog to digital (ADC) and digital to analog (DAC) converters would have perfect linearity. Unfortunately, real-world converters do not have perfect linearity. This characteristic is seen in the finite quantization and precision of the devices. Conversion errors are usually specified as differential nonlinearity (DNL) and integral nonlinearity (INL).

The first level of quantization error, that of the smallest quanta, is often addressed with a small analog noise signal, known as dither, added to the signal of interest.

Errors due to integral nonlineaty (INL) produce spurious products in the digitized spectra, and amplitude errors for signals ranging over the input range of the ADC. In subranging ADC architectures these errors show up as a repeating pattern in the INL vs digital output, which is particularly undesirable when low spurious performance is needed.

A larger amplitude dither signal is required to linearize this type of error. For such INL patterns, an analog dither signal with a uniform amplitude distribution is very desirable for linearization. An example waveform with a uniform amplitude distribution is a triangle wave. However, it is also important that the spectrum of the dither signal be limited so that dither components do not fall within the frequency bands of interest of the ADC application, or may be aliased into frequency bands of interest. It is also desirable that the dither spectrum not be discrete. A triangle wave contains odd harmonics of significant amplitude to tens (or hundreds) of times the fundamental frequency, easily extending into the band of interest, including aliased harmonics.

A sinusoid is spectrally contained, with a discrete spectrum, comprising only a fundamental frequency, but the probability density function (PDF) of a sinusoid is bathtub-shaped, with horns at the edges, as shown in FIG. 2. Such a PDF indicates that the signal spends the majority of its time near the peak magnitudes; this is not the desired uniform distribution.

What is needed is an analog dither signal which is spectrally contained, and tends towards a uniform amplitude distribution.

SUMMARY OF THE INVENTION

An analog dither signal is generated by summing two or more noise-FM signals, signals which are generated by frequency modulating a carrier using independent noise signals. The noise-FM signals may be generated and summed in the digital domain before being converted to an analog signal, or may be generated in the analog domain.

DETAILED DESCRIPTION OF THE EMBODIMENTS

Figure 1:
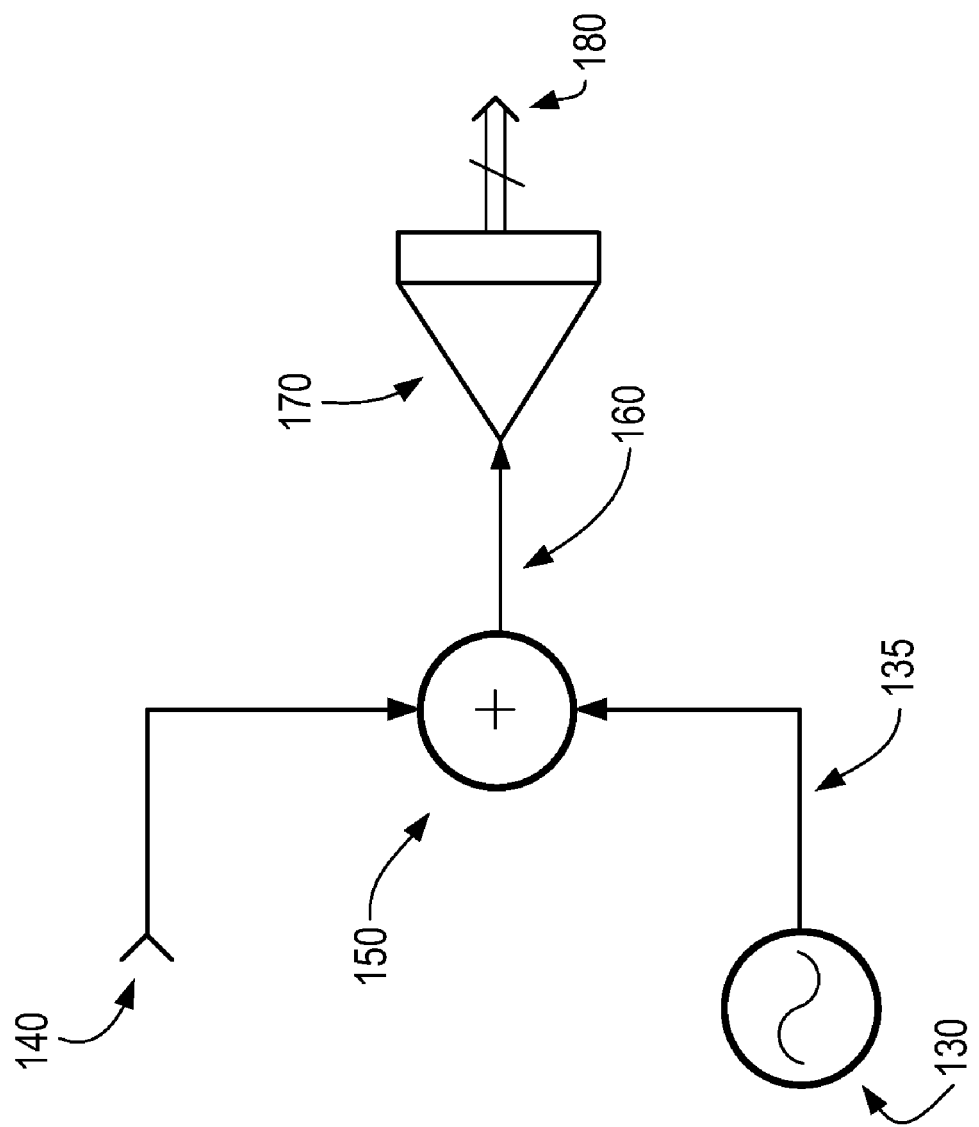
FIG. 1 shows a block diagram of dithering.

FIG. 1 shows a block diagram of dithering as used in analog to digital conversion. Analog input signal 140 is summed 150 with the output 135 of an analog dither signal source 130. Analog signal 160 containing both the input signal and the dither signal is sent to analog to digital converter (ADC) 170, which produces n-bit digital output 180.

A desirable dither signal for linearizing ADCs would have a uniform amplitude distribution, and a bandlimited spectral distribution. While a triangle wave signal has a uniform amplitude distribution, it is not spectrally limited, having odd harmonics. A sine wave has a limited spectral distribution, only the fundamental frequency, but has a bathtub-shaped amplitude distribution, and is spectrally discrete.

Figure 2:
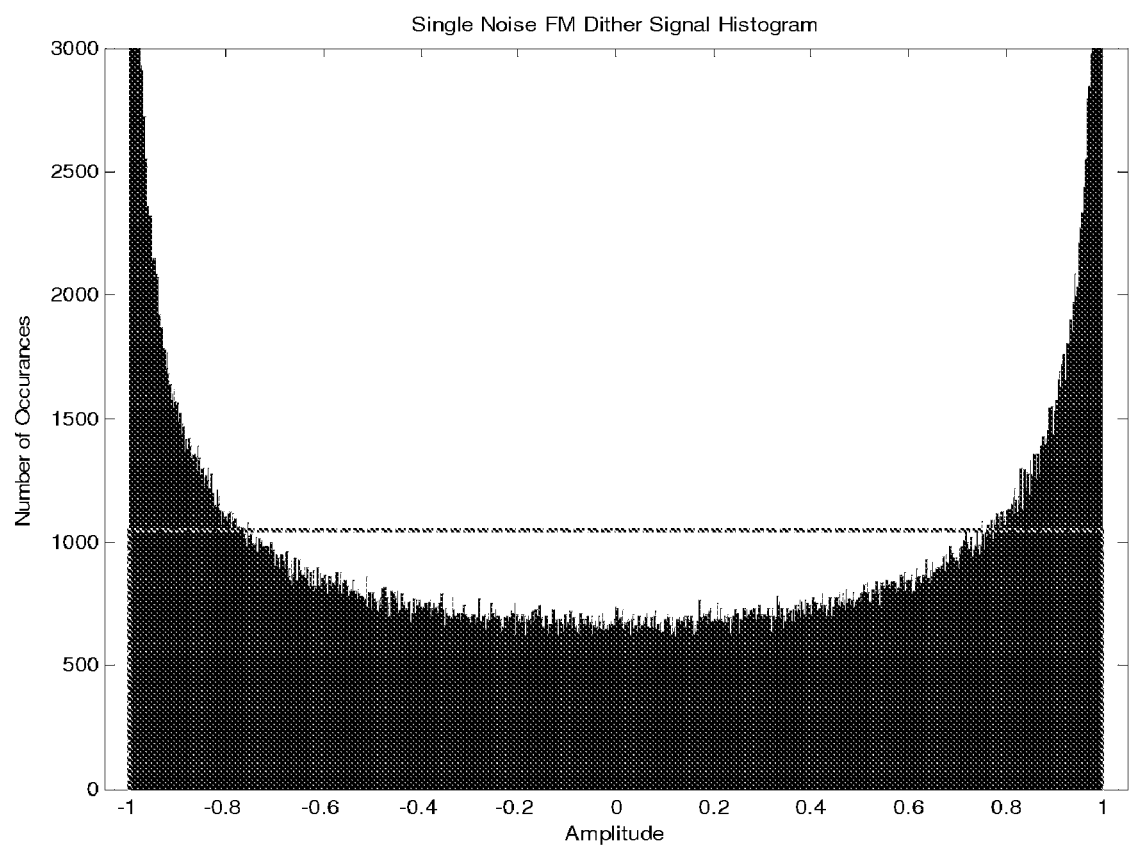
FIG. 2 shows a first dither histogram.

If instead of using a continuous-wave (CW) signal, we frequency modulate (FM) an oscillator with a band-limited noise signal, we will produce a dither signal which is spectrally limited, and not discrete in terms of its spectrum. Unfortunately, the histogram of such a noise FM dither signal, as shown in FIG. 2, still shows the characteristic bathtub-shaped probability distribution function (PDF). Similarly, if we noise-FM a triangle wave, while the resulting waveform has a uniform PDF, it still has a high harmonic content.

Figure 3:
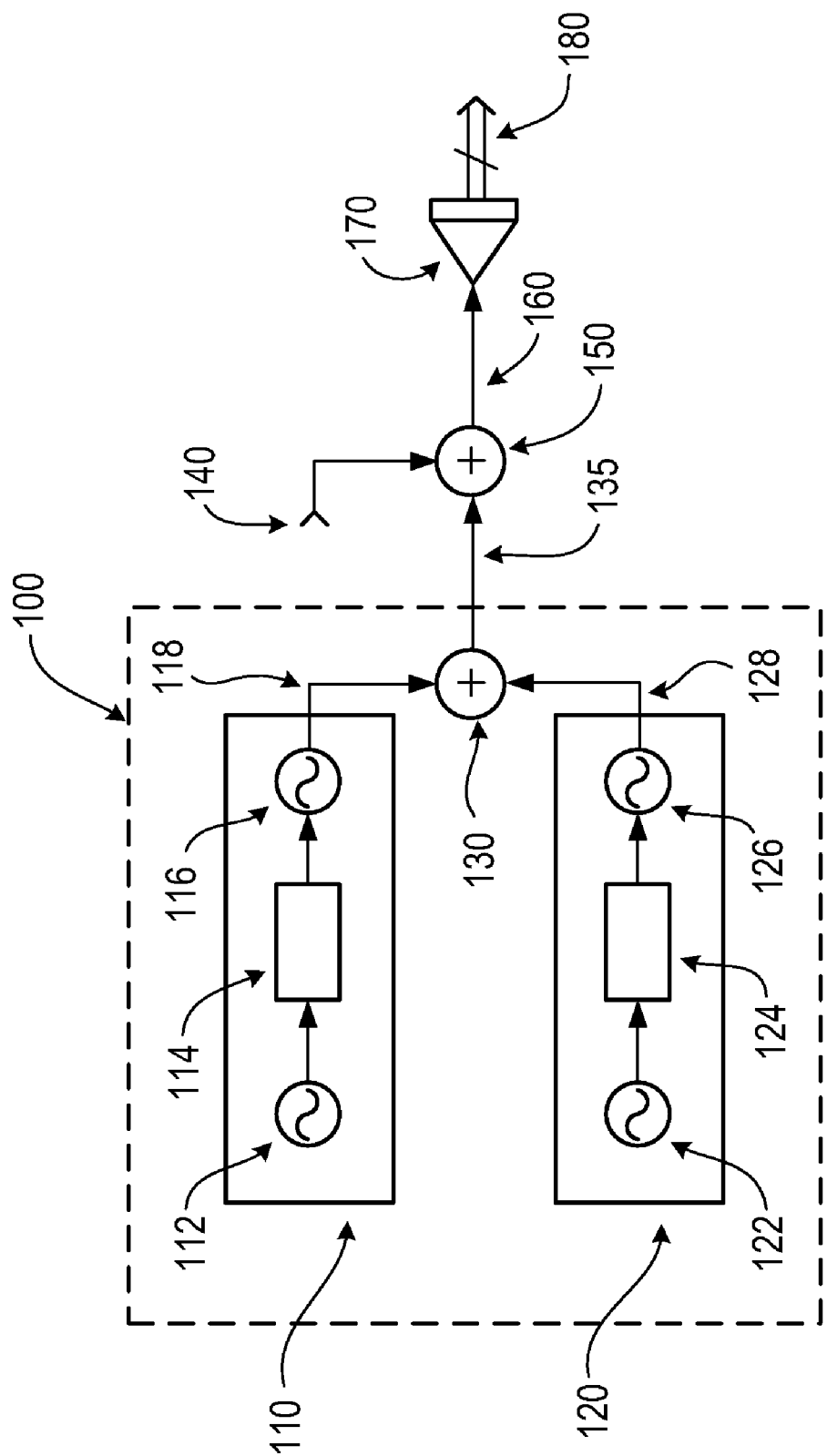
FIG. 3 shows a block diagram of dithering according to the invention.

According to the present invention, and as shown in the embodiment of FIG. 3, summing the outputs of multiple noise-FM signals produces a dither signal which is both band-limited and better approximates a uniform distribution.

In FIG. 3, analog dither signal generator 100 sums 130 signals form independent noise-FM generators 110 and 120 producing analog dither signal 135. This analog dither signal is combined 150 with analog input signal 140 and fed 160 to ADC 170, which produces digital output 180.

Each noise-FM source 110, 120 has an independent noise sources 112, 122. These noise sources are spectrally band limited 114, 124 to provide bandlimited noise spectrum. As an example, a third order Butter worth filter is adequate. In addition, this filter may be used to convert a non-Gaussian noise source to an approximately Gaussian source by virtue of the the Central Limit Theorem. This shaping may not be needed if the output of noise sources 112, 122 have a fractional bandwidth which is sufficiently small that the Central Limit Theorem is valid, that is, noise sources 112, 122 approximate a normal (Gaussian) spectral distribution. The resulting shaped noise signals are used to frequency modulate (FM) oscillators 116, 126, producing noise-FM signals 118, 128. These noise-FM signals 118, 128 are added 130 to produce multiple noise-FM dither signal 135.

Figure 4:
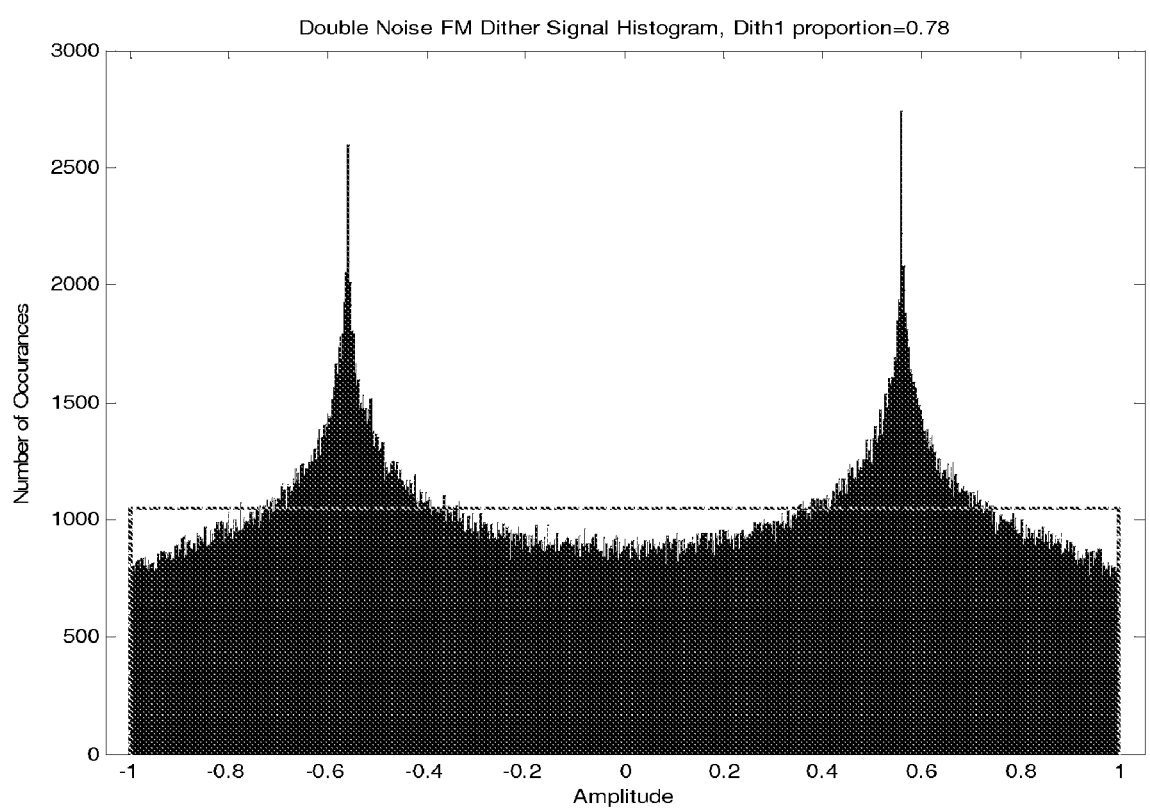
FIG. 4 shows a second dither histogram.

Since sources 112, 122 are independent, the probability distribution function (PDF) of composite dither signal 135 is the convolution of the amplitude bounded PDFs of its constituent components. As such, the composite PDF is still amplitude bounded, but is much more uniform than a single noise-FM dither signal such as that of FIG. 2. The crest factor and histogram shape may be modified by varying the relative amplitudes of the individual noise-FM components. FIG. 4 shows the histogram for a two noise-FM dither signal where the amplitude of one signal is 0.78 and the amplitude of the second signal is 0.22. In FIG. 4, the horizontal line represents a uniform distribution. The resulting dither signal is amplitude bounded, and has an envelope crest factor of less than 1.85 dB.

Implementations of dither signal generator 100 as shown in FIG. 3 may mix analog and digital technology, so long as output 135 is an analog signal. As an example, the implementation of FIG. 3 may be mostly or entirely analog in nature. Noise sources 112, 122 may be analog sources such as Zener diode noise sources or other avalanched PN junctions. Linear feedback shift register (LFSR) generators may also be used, followed by a DAC. Voltage controlled oscillators maybe used for oscillators 116, 126, and their analog output summed 130 also in the analog domain to produce dither signal 135.

Figure 5:
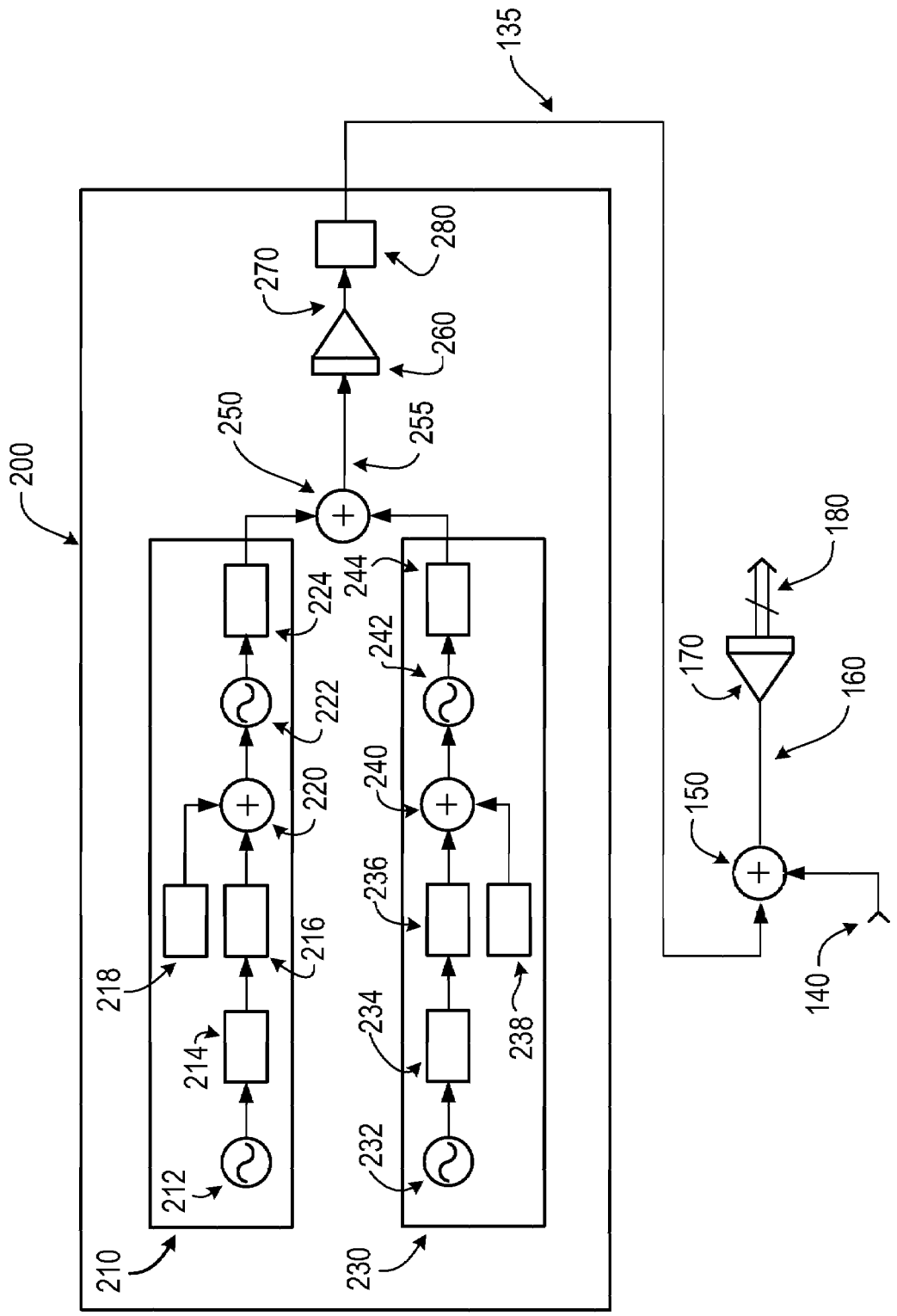
FIG. 5 shows a second block diagram of dithering according to the invention.

FIG. 5 shows a digital implementation, more suitable for digital signal processors, gate arrays, and the like. In this embodiment, noise-FM generators 210 and 230 are digital, with their digital outputs being summed digitally 250 and converted to analog form via digital to analog converter 260, producing analog dither signal 270 which passes through reconstruction filter 280 to produce dither signal 135. In similar fashion to the analog implementation of FIG. 3, analog signal 140 is combined 150 with dither signal 135 and fed to the input of ADC 170, which produces digital output 180.

Examining noise-FM sources 210, 230, each has an independent noise generator 212 232. This may be in the form of a linear congruence pseudo-random number generator, linear feedback shift register generator, or other digital technique known to the art. The resulting digital noise streams are amplitude converted 214 234 to produce approximately Gaussian distributions, for example, using a table lookup. These noise distributions are then shaped and band limited 216 236, and sunned 220 240 with center frequency values 218 238 to drive numerically controlled oscillators (NCO) 222 242. Blocks 214 234 convert the input amplitude distribution into an approximately Gaussian form. Filters 216 236 spectrally limit the noise spectrums. If the fractional bandwidths of filters 216 236 are sufficiently small, blocks 214 234 may not be required as long as the Central Limit Theorem holds. The real part of the NCO output is extracted 224 244 and summed 250. This sum 255 is passed to digital to analog converter (DAC) 260, converting digital datastream 255 to an analog voltage 270 This analog voltage passes through reconstruction filter 280 producing analog dither signal 135.

While the embodiment of FIG. 5 shows the digital to analog boundary after summing 250, the conversion from digital to analog may take place at other points. Each noise-FM generator 210 230 may have its own DAC and reconstruction filter, so that summing 250 now takes place in the analog domain, the resulting analog dither signal feeding input summing node 150 directly. (more likely: digital noise source, dac, vco;

While these and other implementation tradeoffs will be apparent to those skilled in the art, care must be taken that the noise sources used (112 122 of FIG. 3, 212 232 of FIG. 5) are essentially independent and that the noise signals used to frequency modulate the oscillators (VCO 116 126 of FIG. 3, NCO 224 244 of FIG. 5) are appropriately spectrally shaped and Gaussian in nature.

The noise sources are sufficiently independent that the PDF of the sum is well approximated by the convolution of their densities for observation periods of interest. As an example, a PRNG with a cycle length of an hour could be used for both sources, with one source seeded at the halfway point. This will be adequate for observation periods of under a second.

The summing (150 in FIG. 3, 250 in FIG. 5) of the individual noise-FM signals is a weighted sum. Varying the weights (amplitudes) of the individual noise-FM signals will modify the resulting crest factor and overall PDF.

FIG. 4 shows an example where one noise-FM signal is given the weight 0.78 and the second noise-FM signal is given the weight 0.22, resulting in a low difference between the resulting histogram and a uniform distribution.

Figure 6:
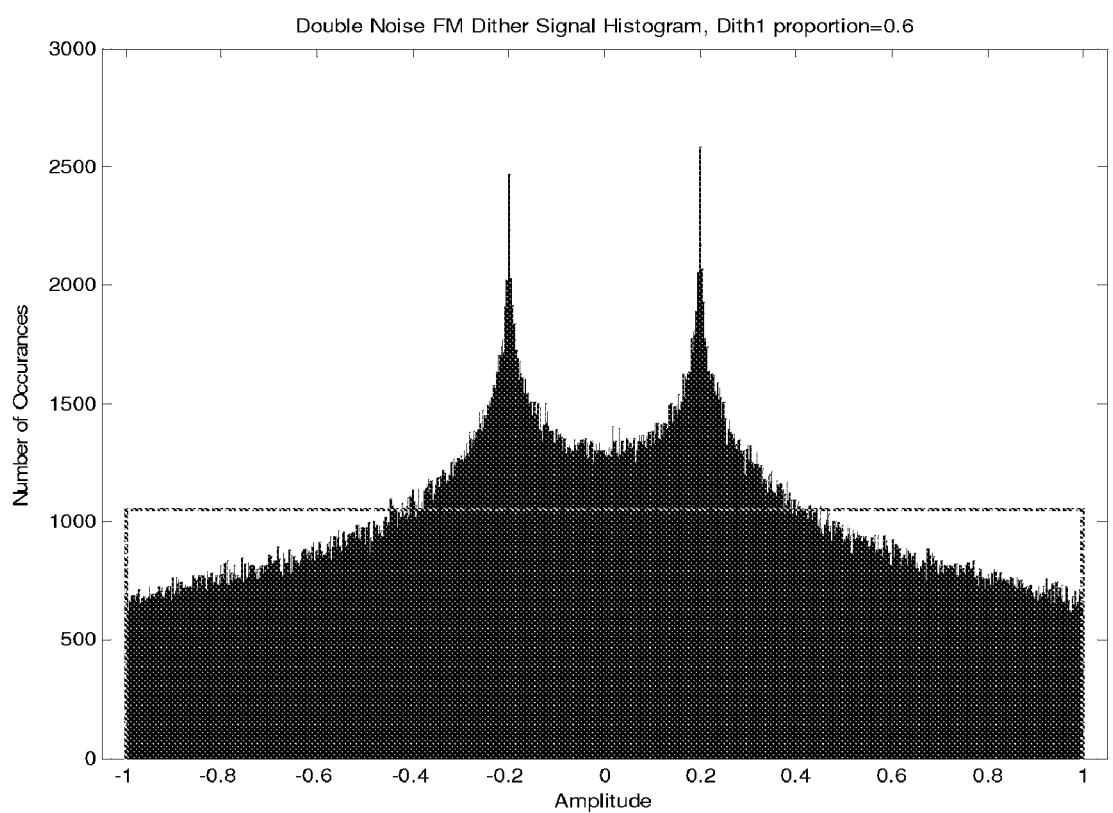
FIG. 6 shows a third dither histogram.

FIG. 6 shows an example were the weighting is 0.60 and 0.40, resulting in a slightly higher crest factor of 2.88 dB in comparison to FIG. 4's crest factor of about 1.85 dB.

Figure 7:
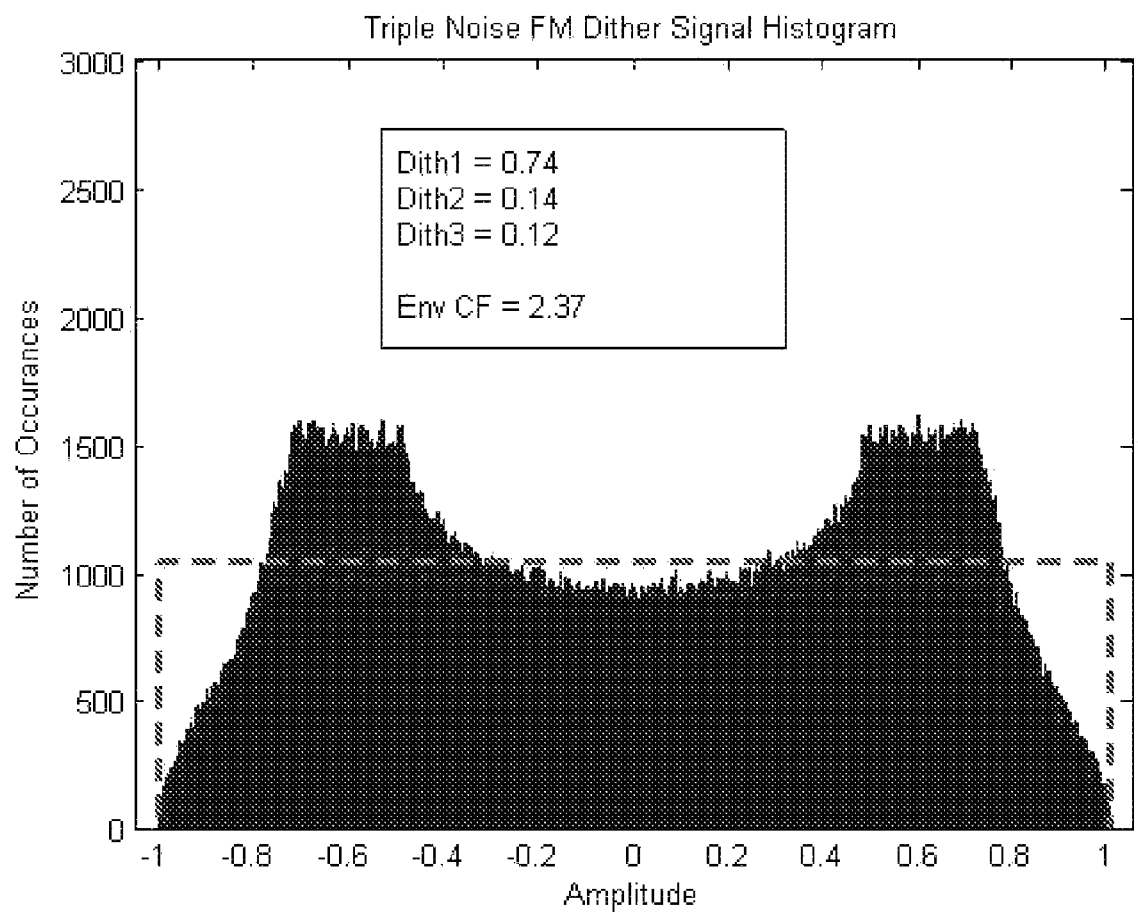
FIG. 7 shows a fourth dither histogram.

While the examples shown have used two independent noise-FM sources, it is possible to use more than two, further smoothing the resulting PDF, at a cost of complexity and crest factor. FIG. 7 shows an example using three noise-FM sources, with weights 0.74, 0.14, and 0.12, resulting in an envelope crest factor of 2.37 dB.

Figure 8:
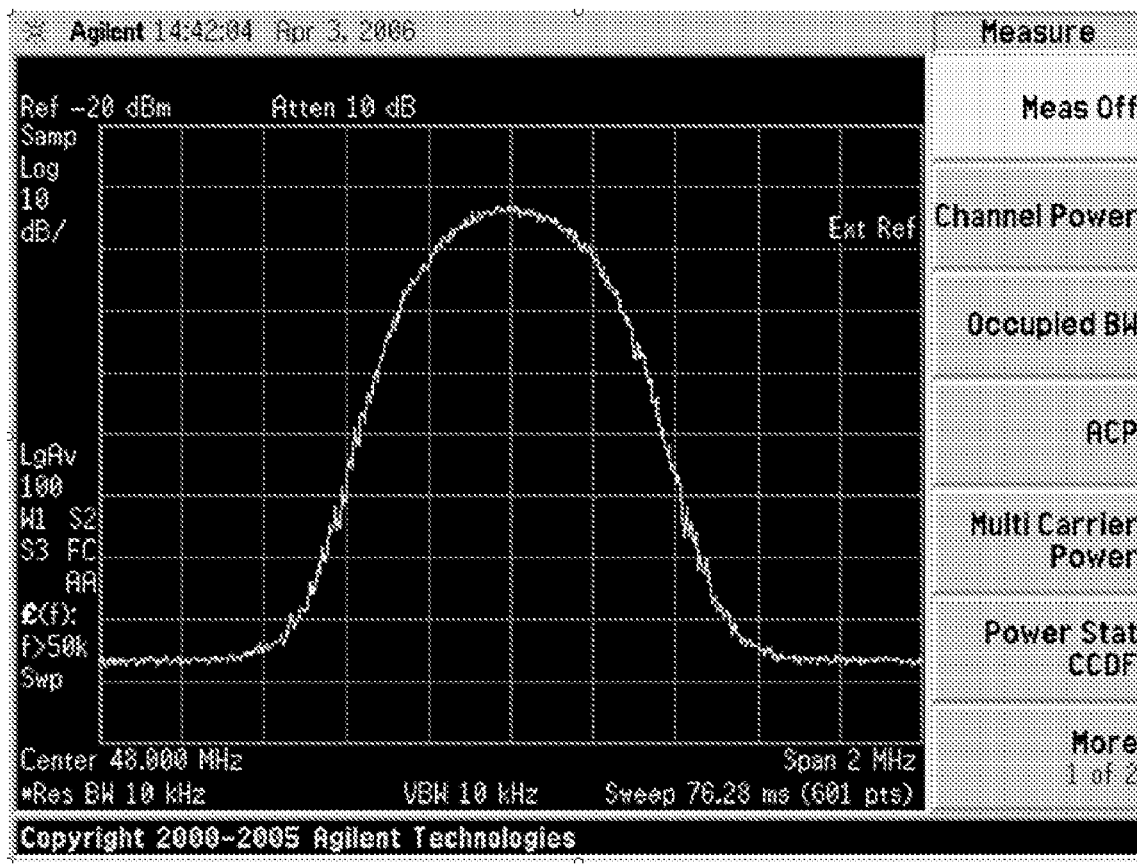
FIG. 8 shows a FM dither spectrum.

FIG. 8 shows the spectrum of a two noise-FM dither signal. (George has a discussion of spectral characteristics).

While the embodiments of the present invention have been illustrated in detail it should be apparent that modifications and adaptations to these embodiments may occur to one skilled in the art without departing from the scope of the present invention as set forth in the following claims.

The invention claimed is:

1. A dither signal generator comprising:
 a plurality of noise-FM sources, each noise-FM source comprising a carrier generator which is frequency modulated by an independent noise source, and
 a summing node summing the plurality of noise-FM sources to produce a dither.

2. The dither signal generator of claim 1 where each noise-FM source produces a digital signal.

3. The dither signal generator of claim 2 where the digital noise-FM signals are summed and further converted to an analog dither signal.

4. The dither signal generator of claim 1 where each noise-FM source produces an analog signal.

5. The dither signal generator of claim 4 where the analog noise-FM signals are summed to produce an analog dither signal.

6. The dither signal generator of claim 1 where two noise-FM sources are used.

7. The dither signal generator of claim 1 where more than two noise-FM sources are used.

8. A method of generating a dither signal comprising:
 generating a plurality of noise-FM signals, each noise-FM signal produced by frequency modulating a carrier with a noise signal, and
 summing the noise-FM signals to produce a dither signal.

9. The method of claim 8 where the noise-FM signals are generated and summed digitally, then converted to analog to produce an analog dither signal.

10. The method of claim 8 where each noise-FM signal is an analog signal.

11. The method of claim 8 where the noise signals are generated digitally and converted to analog signals used to frequency modulate the carrier.

12. The method of claim 8 where the noise signals are generated in analog form.

13. The method of claim 8 where two noise-FM signals are used.

14. The method of claim 8 where more than two noise-FM signals are used.

15. A dither signal generator comprising:

a plurality of noise-FM sources, each noise-FM source comprising a carrier generator which is frequency modulated by an independent noise source and a noise generator feeding a noise shaping and scaling filter; and a summing node summing the plurality of noise-FM sources to produce a dither.

16. The dither signal generator of claim 15 where the noise source and shaping and scaling filter produces a signal having a bandlimited Gaussian amplitude distribution.

17. A method of generating a dither signal comprising:

generating a plurality of noise-FM signals, each noise-FM signal produced by frequency modulating a carrier with a noise signal, and summing the noise-FM signals to produce a dither signal, wherein the noise signal has a Gaussian amplitude distribution.

18. The method of claim 17 where the noise signal has a bandlimited Gaussian amplitude distribution.

* * * * *